United States Patent [19]

Azuma et al.

[11] Patent Number: 5,614,018
[45] Date of Patent: Mar. 25, 1997

[54] INTEGRATED CIRCUIT CAPACITORS AND PROCESS FOR MAKING THE SAME

[75] Inventors: Masamichi Azuma; Carlos A. Paz De Araujo; Michael C. Scott; Joseph D. Cuchiaro, all of Colorado Springs, Colo.

[73] Assignees: Symetrix Corporation, Colorado Springs, Colo.; Matsushita Electronics Corporation, Osaka, Japan

[21] Appl. No.: 273,592

[22] Filed: Jul. 11, 1994

Related U.S. Application Data

[63] Continuation-in-part of Ser. No. 165,082, Dec. 10, 1993, which is a continuation-in-part of Ser. No. 132,744, Oct. 6, 1993, Pat. No. 5,514,822, which is a continuation-in-part of Ser. No. 993,380, Dec. 18, 1992, Pat. No. 5,456,945, Ser. No. 981,133, Nov. 24, 1992, Pat. No. 5,423,285, and Ser. No. 965,190, Oct. 23, 1992, abandoned, which is a continuation-in-part of Ser. No. 807,439, Dec. 13, 1991, abandoned, said Ser. No. 981,133, is a continuation-in-part of Ser. No. 807,439.

[51] Int. Cl.⁶ .................................................. C30B 9/08
[52] U.S. Cl. ......................... 117/68; 117/70; 117/947
[58] Field of Search ........................... 117/68, 70, 947

[56] References Cited

U.S. PATENT DOCUMENTS

| | | | |
|---|---|---|---|
| 4,437,139 | 3/1984 | Howard | 361/313 |
| 4,870,539 | 9/1989 | Chance et al. | 361/321 |
| 5,160,762 | 11/1992 | Brand et al. | 427/79 |
| 5,330,931 | 7/1994 | Emesh et al. | 437/60 |
| 5,386,120 | 1/1995 | Micheli et al. | 250/338.2 |

FOREIGN PATENT DOCUMENTS

| | | |
|---|---|---|
| 125507 | 11/1984 | European Pat. Off. . |
| 0618598A1 | 10/1994 | European Pat. Off. ......... H01G 4/20 |
| 0631319A1 | 12/1994 | European Pat. Off. ...... H01L 27/115 |

OTHER PUBLICATIONS

E. Fujii, et al.; ULSI DRAM Technology with $Ba_{0.7}Sr_{0.3}TiO_3$ Film of 1.3nm Equivalent $SiO_2$ Thickness and $10^{-9}$ A/cm² Leakage Current; IEDM Technical Digest, 1992; pp. 10.3.1–10.3.4.

Kuniaki Koyama, et al.; A Stacked Capacitor with $(Ba_xSr_{1-x})TiO_3$ For 256 DRAM; IEDM, Dec. 1991; pp. 32.1.1–32.1.4.

W.D. Kingery, et al.; Introduction to Ceramics, Second Edition; pp. 969–971.

G.M.Vest, et al.; Synthesis of Metallo–Organic Compounds For MOD Powders and Films; Materials Research Society Symp. Proc. vol. 60, 1986; pp. 35–42.

Robert W. Vest, et al.; $PbTiO_3$ Films From Metalloorganic Precursors; IEEE Transactions on Ultrasonics, Ferroelectrics, and Frequency Control, vol. 35, No. 6, Nov. 1988; pp. 711–717.

M. Azuma, et al.; Electrical Characteristics of High Dielectric Constant Materials For Integrated Ferroelectrics; ISIF, 1992; pp. 109–117.

(List continued on next page.)

*Primary Examiner*—Robert Kunemund
*Attorney, Agent, or Firm*—Duft, Graziano & Forest, P.C.

[57] ABSTRACT

A xylene exchange is performed on a stock solution of BST of greater then 99.999% purity dissolved in methoxyethanol, and a carboxylate of a dopant metal, such as magnesium 2-ethylhexanoate is added to form a precursor. The precursor is spun on a first electrode, dried at 400° C. for 2 minutes, then annealed at 750° C. to 800° C. for about an hour to form a layer of accurately doped BST. A second electrode is deposited, patterned, and annealed at between 750° C. to 800° C. for about 30 minutes. Excellent leakage current results if the dopant is magnesium of about 5% molarity. For other dopants, such as Mg, Nb, Y, Bi, and Sn the preferred dopant range is 0.2% to 0.3% molarity. The magnesium-doped material is used as a buffer layer between the electrodes and BST dielectric of an undoped BST capacitor.

28 Claims, 7 Drawing Sheets

OTHER PUBLICATIONS

J.V. Mantese, et al.; Metalorganic Deposition (MOD): A Nonvacuum, Spin–on, Liquid–Based, Thin Film Method; MRS Bulletin, Oct. 1989; pp. 48–53.

B.M. Melnick, et al.; Process Optimization and Characterization of Device Worthy Sol–Gel Based PZT For Ferroelectric Memories; Ferroelectrics, 1990, vol. 109, 1990; pp. 1–23.

Jiyoung Kim et al.; La Doped PZT Films for Gigabit DRAM Technology; Jul. 6, 1994; Symposium on VLSI Technology Digest of Technical Papers; Jun. 7–9, 1994/Honolulu.

Hong–Wen Wang, et al.; The Effect of Dysprosium on the Microstructure and Dielectric Properties of $(Ba_{1-x}Sr_x)TiO_3$ Ceramics; ISAF'92; Proceedings of the Eighth IEEE International Symposium on Applications of Ferroelectrics; Greenville, SC; Aug. 30–Sep. 2, 1992.

INTEGRATED CIRCUIT CAPACITORS AND PROCESS FOR MAKING THE SAME

BACKGROUND OF THE INVENTION

This application is a continuation-in-part of U.S. patent application Ser. No. 08/165,082 filed Dec. 10, 1993 pending which is itself a continuation-in-part of U.S. patent application Ser. No. 08/132,744 filed Oct. 6, 1993, now U.S. Pat. No. 5,514,822 which in turn is a continuation-in-part of U.S. patent application Ser. No. 07/993,380 filed Dec. 18, 1992, now U.S. Pat. No. 5,456,945 U.S. patent application Ser. No. 07/981,133 filed Nov. 24, 1992, now U.S. Pat. No. 5,423,285 and U.S. patent application Ser. No. 07/965,190 filed Oct. 23, 1992 now abandoned; the latter two applications are in turn continuations-in-part of U.S. patent application Ser. No. 07/807,439 filed Dec. 13, 1991 now abandoned.

FIELD OF THE INVENTION

The invention in general relates to the fabrication of integrated circuits utilizing metal oxides, such as barium strontium titanate, and more particularly to the use of doping in the fabrication of such materials in integrated circuits.

STATEMENT OF THE PROBLEM

Metal oxide materials, such as barium strontium titanate, commonly referred to as BST, are known to be useful in making integrated circuit thin film capacitors having high dielectric constants. See for example, Kuniaki Koyama, et al., "A Stacked Capacitor With $(Ba_xSr_{1-x})TiO_3$ For 256M DRAM" in IDEM(International Electron Devices Meeting) Technical Digest, December 1991, pp. 32.1.1–32.1.4, and U.S. Pat. No. 5,122,923 issued to Shogo Matsubara et al. It is known that adding dopants to barium titanate affects its electrical and dielectric properties. See A. J. Moulson and J. M. Herbert, *Electroceramics: Materials-Properties-Application*, Chapman and Hall, New York pp. 32–35 and 242–247. In particular, it is known that the dissipation factor, tan δ, may be reduced by adding dopants, such as manganese (Mn). See Moulson et al. at p. 247. However, while the effects of some dopants is known, it is also known to be much harder to accurately control electrical properties in oxides using dopants than it is in other materials, such as silicon semiconductors. See Moulson et al. at page 34. It is well-known that oxides typically include high levels of impurities, with even "high purity" oxides including impurities of greater than 10 parts per million. Id. at p. 34. Further, the usual methods of making oxides such as BST, i.e. sputtering and pressing of powders, are inherently hard to control. In both processes the dopants tend to be more concentrated in some parts of the fabricated device than in others. Other methods of adding dopants which are commonly used in integrated circuits, such as ion implantation, are not as effective with metal oxides as with silicon, since the metal oxide are much denser materials. Thus with the prior art processes, while one can add dopants to metal oxides, and while one can measure the amount of dopants present in a metal oxide and the electrical properties, it has not been possible to accurately predict the precise amount of dopants that will be present in a metal oxide fabricated according to a given process. Thus it has not up to now been possible to precisely control the electrical properties of metal oxides, on the microscopic level needed to produce consistent integrated circuits, with the same accuracy that one can control the electrical properties of silicon semiconductors, for example. Moreover, integrated circuits require that the materials be made as thin films, and the thin films made with the prior art processes always produces electrical properties were a hundred to ten thousand time less desirable than the properties of the bulk devices made with the same materials.

It is well-known, to use the process of spin coating for making certain types of insulators in integrated circuits, such as spin-on glass (SOG); the process had also been used for making metal oxides such as barium titanate, strontium titanate, and barium strontium titanate. See G. M. Vest and S. Singaram, "Synthesis of "Metallo-organic Compounds For MOD Powders and Films", *Materials Research Society Symposium Proceedings*, Vol. 60, 1986, pp. 35–42, Robert W. Vest and Jiejie Xu, "$PbTiO_3$ Thin Films From Metalloorganic Precursors", *IEEE Transactions On Ultrasonics, Ferroelectrics, and Frequency Control*, Vol 35, No. 6, November 1988, pp. 711–717, and "Metalorganic Deposition (MOD): A Nonvacuum, Spin-on, Liquid-Based, Thin Film Method", *Materials Research Society Bulletin*, October 1989, pp. 48–53. However, the quality of the thin films made in these references was again far too poor for use in integrated circuits. The electronic properties were far inferior to the corresponding properties measured on bulk devices. Thus these processes have, up to the time of the present invention, been used for screen printing of metal oxide inks in making relatively macroscopic parts of circuits. Further, this spin-on method resulted in very little control over crystal defects. Since crystal defects have as great an effect on electrical properties as dopants, this spin-on technique did not appear to be a suitable candidate for a fabrication process in which the electronic properties of metal oxides could be controlled by use of dopants. Thus, up to now, no method of fabrication of thin film oxides, such as BST, that permits accurate control of their electronic properties utilizing doping and electronic properties comparable to the bulk properties, such as can be done with silicon and gallium arsenide semiconductors, has been known.

SOLUTION OF THE PROBLEM

The invention solves the problem of providing control of electronic properties of metal oxides via doping with sufficient accuracy for microscopic integrated circuit applications by utilizing liquid precursors. Preferably a metal carboxylate or metal alkoxide is used as the dopant precursor. The process incorporates a variety of careful controls. For example, copending and co-owned U.S. patent application Ser. No. 08/165,082, incorporated herein by reference, discloses that by carefully controlling the drying and annealing process, defect-free BST integrated circuit devices can be made by applying liquid precursors to integrated circuit substrates. This careful control of the drying and annealing process is also useful when adding dopants to the material. The use of extremely high purity materials, i.e. materials with less than 10 parts per million in impurities, is also an important factor. In addition, the selection of the solvent and the molarity of the precursor solution, are also important. In the preferred embodiment of the invention, an alcohol, such as 2-methoxyethanol, is used as the basic solvent during precursor preparation and storing, and a xylene exchange step is performed just prior to fabrication to change the solvent to xylene. Preferably, the molarity of the precursor should be from 0.10 to 0.35 moles.

The use of a liquid precursor process to add dopants to BST and other metal oxides permits much more accurate control of the microscopic content and distribution of the dopants throughout the metal oxide. Thus the electronic properties can be more precisely controlled than with prior art methods of adding dopants. Numerous other features, objects and advantages of the invention will become apparent from the following description when read in conjunction with the accompanying drawings.

DETAILED DESCRIPTION OF THE PREFERRED EMBODIMENT

Figure 1:
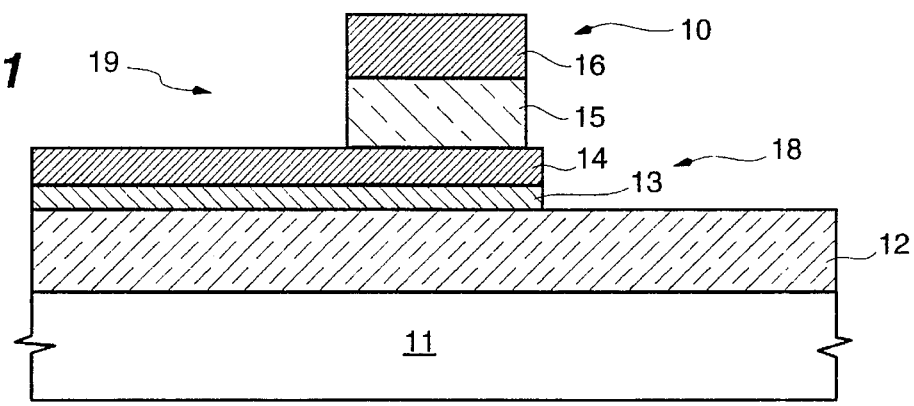
FIG. 1 is a cross-sectional view of an integrated circuit capacitor according to the invention.

Turning to FIG. 1, a thin film capacitor 10 as fabricated in the examples discussed below is shown. The capacitor 10 is formed on a single crystal silicon wafer 11 having a thick layer 12 of silicon dioxide formed on it in a known manner. An adhesion layer 13 of titanium of about 200 Å thickness is then formed followed by a first electrode layer 14 of platinum, of about 2000 Å thickness. Both layers 13 and 14 are preferably formed by sputtering. Then a layer 15 of a dielectric, preferably a metal oxide, such as BST, is formed, the BST 15 preferably doped as described in detail below. Then a second electrode 16, also preferably of about 2000 Å thick platinum, is formed, again preferably by sputtering.

In the integrated circuit art, the silicon crystal 11 is often referred to as a "substrate". Herein, "substrate" may be used to refer to the silicon layer 11, but more generally will refer to any support for another layer. For example, the substrate 18 for the dielectric layer 15 is, immediately, the platinum first electrode 14, but also can interpreted broadly to include the layers 11, 12, and 13 as well. The term "metal oxide" herein means a material of the general form $ABO_3$ where A and B are cations and O is the anion oxygen. The term is intended to include materials were A and B represent multiple elements; for example, it includes materials of the form $A'A''BO_3$, $AB'B''O_3$, and $A'A''B'B''O_3$, where $A', A'', B'$ and $B''$ are different metal elements. Preferably, $A, A', A''$, are metals selected from the group of metals consisting of Ba, Bi, Sr, Pb, Ca, and La, and B, B', and B'' are metals selected from the group consisting of Ti, Zr, Ta, Mo, W, and Nb. Preferably the metal oxide is a perovskite. Many of these metal oxides are ferroelectrics, though some that are Classed as ferroelectrics may not exhibit ferroelectricity at room temperature. However, since most such ferroelectrics have relatively high dielectric constants, these materials are often useful in high dielectric constant capacitors, whether or not they are ferroelectric. Preferably the doping materials are selected from the group consisting of magnesium, niobium, yttrium, bismuth, tin, dysprosium oxide, $BaZn_{1/3}Nb_{2/3}O_3$, $SrTa_2O_6$, and strontium bismuth tantalate. In the discussions below, and particularly with respect to the abscissas of FIG. 5 and 8 through 15, the amount of dopant material is expressed in terms of mole % units, sometimes abbreviated as mol. %. For single element dopants, and small dopant percentages, this unit may be thought of as a measure of the number of atoms of the dopant material as a percentage of the number of A atoms or number of B atoms in the oxide. More accurately and more generally, the unit is the total number of dopant molecules as a percentage of the total number of molecules in the crystal. For example, if the material is $Ba_{0.7}Sr_{0.3}TiO$, the dopant is dysprosium oxide, and the dopant mole percentage is 10%, then for every ten molecules of BST and dysprosium oxide combined, there is 1 molecule of dysrosium oxide.

Figure 2:
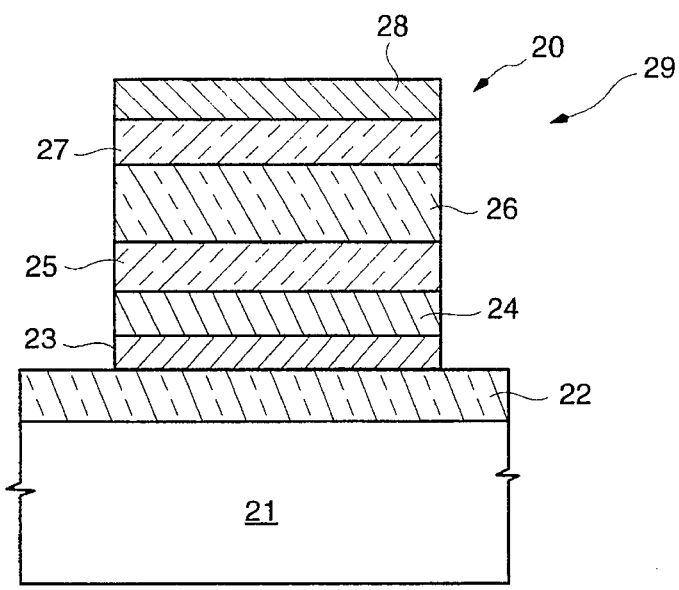
FIG. 2 is a cross-sectional view of another embodiment of an integrated circuit capacitor according to the invention which includes low leakage dielectric buffer layers.

Another embodiment of a capacitor 20 according to the invention is shown in FIG. 2. this capacitor includes substrate 21, insulating layer 22, adhesion layer 23, first electrode 24, second electrode 28, buffer layers 25 and 27, and dielectric layer 26, which is preferably a ferroelectric material or other metal oxide. Buffer layers 25 and 27 are preferably made of a low-leakage dielectric material such as magnesium-doped BST fabricated as described below. Other materials that are useful as the buffer layers 25 and 27 are $SiO_2$, $Si_3N_4$, $Ta_2O_5$, and $SrTiO_3$. The low-leakage buffer layers 25 and 27 are used when the principal dielectric 26 has more electrical leakage than desirable; for example, some ferroelectric materials of high polarizability, such as those used in non-volatile memories, may have too high of leakage current, and therefore low-leakage buffer layers 25, 27 are useful to decrease the overall leakage of the capacitor 20.

Figure 3:
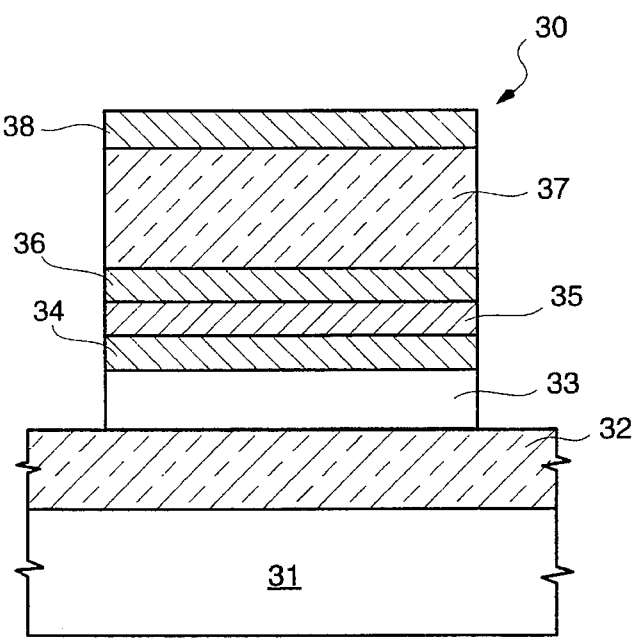
FIG. 3 is a cross-sectional view of a further exemplary embodiment of an integrated circuit capacitor according to the invention which includes adhesion and barrier layers.

A third embodiment of a capacitor 30 according to the invention is shown in FIG. 3. This embodiment also includes substrate 31, insulating layer 32, adhesion layer 34, first electrode 36, second electrode 38, and a dielectric material 37 made by the process described below. It also includes a polysilicon layer 33 and a barrier layer 35 preferably made of titanium nitride. The details of these layers and their fabrication, as well as adhesion layer 23 are given in U.S. patent application Ser. No. 08/165,133 which is hereby incorporated by reference.

Many other materials may be used for any of the layers discussed above, such as silicon nitride for insulating layers 12, 22, and 32, gallium arsenide, indium antimonide, magnesium oxide, strontium titanate, sapphire or quartz for substrate 11, 21, or 31, and many other adhesion layer, barrier layer, and electrode materials. Further, it should be understood that FIGS. 1, 2, are not meant to be actual cross-sectional views of any particular portion of an actual electronic device, but are merely idealized representations which are employed to more clearly and fully depict the structure and process of the invention than would otherwise be possible. For example, the relative thicknesses of the individual layers are not shown proportionately, since otherwise, some layers, such as the substrate 21 and insulator 22, would be so thick as to make the drawing unwieldy. It should also be understood that the capacitors 10, 20 and 30 preferably form a portion of an integrated circuit 19, 29, and 39 which includes other electronic devices, such as transistors, other capacitors etc., which other devices are not shown for clarity. In addition, the doped dielectric layers 15, 26, and 37 may be incorporated into other devices, such as ferroelectric FETs, as well as capacitors.

Figure 4:
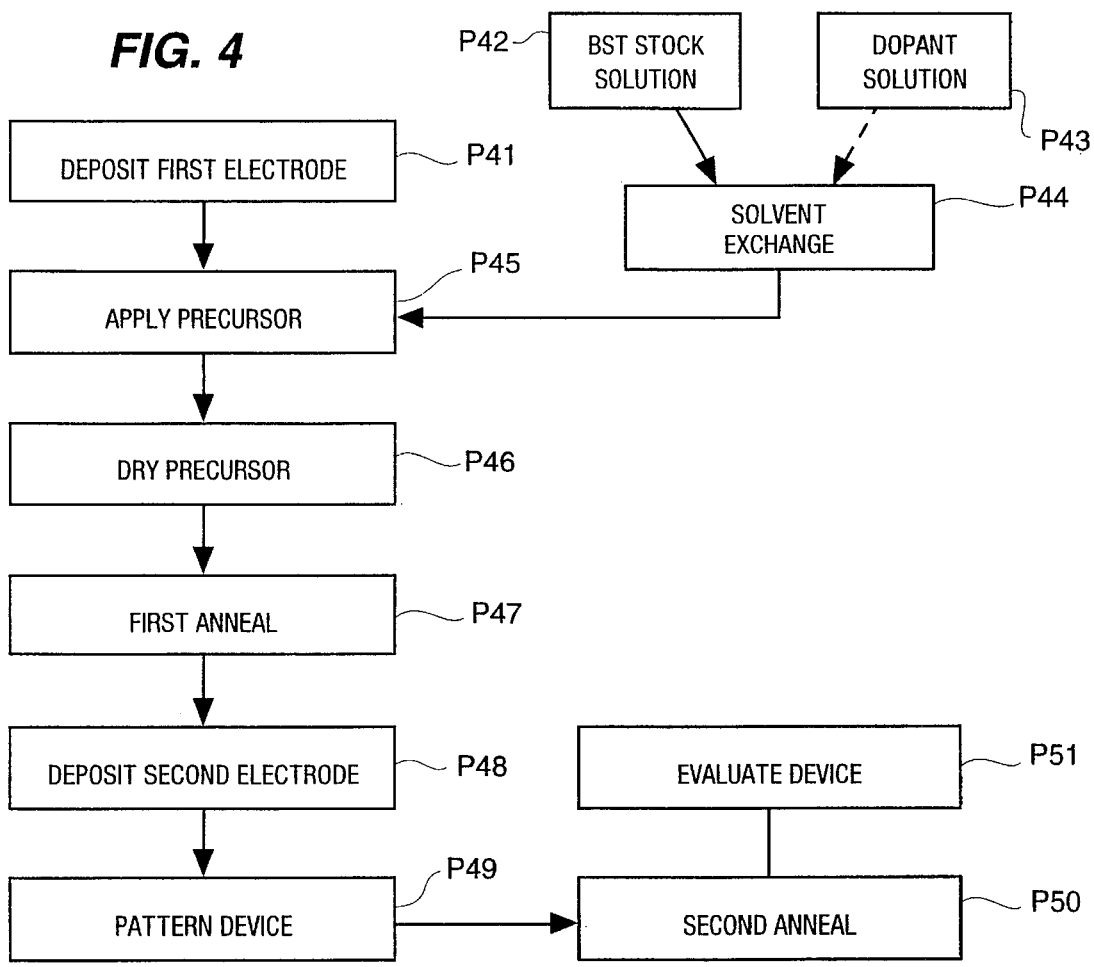
FIG. 4 is a flow chart of a process according to the invention for fabricating a doped BST capacitor.

Turning now to FIG. 4, a flow chart of the process for fabricating capacitors 10, 20 and 30 according to the invention is shown. The process shall be discussed in terms of the embodiment of FIG. 1, but could just as well be discussed in terms of the other embodiments also. In step P41 a first electrode 14 is deposited, preferably by sputtering platinum as is known in the art. A BST stock solution is prepared in step P42. This step may be done just prior to deposition of dielectric 15, but is generally done well in advance. The solution preparation steps P42, P43, and P44 are preferably done under an inert atmosphere. The BST stock solution is a precursor as described in U.S. patent application Ser. No. 08/132,744 which is hereby incorporated by reference. In summary, it is made by reacting barium with 2-methoxyethanol and 2-ethylhexanoic acid, adding strontium, allowing the mixture to cool, adding titanium isopropoxide and 2-methoxyethanol, and heating to obtain a final BST concentration of about 0.5 moles. If a dopant is to be added, a dopant precursor solution is prepared in step P43. It preferably is made by reacting a the dopant with a carboxylic acid, such as 2-ethylhexanoic acid, to form a carboxylate, such as 2-ethylhexanoate, or by reacting the dopant with an alcohol, such as 2-methoxyethanol, to form a metal alkoxide, or a combination of an alcohol and a carboxylic acid to form an alkoxycarboxylate. Some carboxylates that may be used in addition to 2-ethylhexanoates are octanoates and neodecanoates, though the carboxylates having 8 carbon links are preferred. The solvent exchange step P44 is then performed. The solvent exchange primarily replaces a solvent that is convenient for manufacturing the stock solution and/or which makes a precursor that stores well, for a solvent that has a good viscosity for the application process, such as spinning. Here "good" viscosity preferably means a lower viscosity than the stock solution. If an carboxylate dopant precursor is used, the solvent exchange is preferably performed on the BST stock solution first, as shown by the solid arrow, and then the dopant solution is added as shown by the dotted arrow. However, if an alcohol-based dopant precursor is used, the BST stock solution and the dopant solution may be combined and the solvent exchange performed afterwards. Preferably, in the solvent exchange, xylene is exchanged for the 2-methoxyethanol solvent of the BST stock solution. In the xylene exchange, xylene is added to the solution and the solution is heated to about 130° C. while stirring to boil away the other solvents, such as 2-methoxyethanol. The solvent exchange step, while very useful, is not necessary. The mixed BST and dopant solution may be used directly, particularly for some dopants. N-butyl acetate also has been found to be a solvent that works well, thus the solvent exchange may be an n-butyl acetate exchange. This method of forming the precursor allows extremely accurate amounts of the dopant to be added to the BST, and the thorough stirring in the solvent exchange step, or other mixing step, ensures uniform dispersion of the dopant throughout the BST. The carboxylate process is important here because gels are not formed, which gels would tend to impede the mixing and uniform dispersion of the dopant into the BST. All liquid chemicals used in making the precursors, such as xylene, n-butyl acetate, and 2-methoxyethanol are preferably semiconductor grade chemicals, which is a well-known term in the semiconductor art.

In step P45 the precursor is applied to the substrate 18, preferably by spinning at 1500 RPM to 2000 RPM for 20 seconds to 60 seconds. However, other application methods may be used, for example, a misted deposition process as described in U.S. patent application Ser. No. 07/993,380, which is hereby incorporated by reference. In steps P46 and P47 the precursor is treated to form metal oxide dielectric material 15 on substrate 18. The treating is preferably by drying and annealing. In step P46 the precursor is dried, preferably in air or dry nitrogen, and preferably at a relatively high temperature as compared to the prior art, i.e. at from 300° C. to 500° C. for from 1 minute to 20 minutes. Typically it is performed at 400° C. for 2 minutes in air. This high temperature drying step has been found to be essential to obtain predictable properties in doped BST. The application and drying steps, P45 and P46, may be repeated several times to form several coats of the film to fabricate a layer 15 of the desired thickness. Then, in step P47, the dried precursor is annealed to form dielectric 15. The annealing is referred to as the 1st anneal to distinguish it from a later anneal. The anneal is Preferably performed in oxygen at a temperature of from 650° C. to 850° C. Typically, it is performed at 800° C., for 40 minutes to 90 minutes, and preferably about 60 minutes, in $O_2$ in a push/pull process including 5–30 minutes and preferably 10 minutes for the "push" into the furnace, and 5–30 minutes and preferably 10 minutes for the "pull" out of the furnace. Careful control of this anneal temperature and time is also essential for predicable doping results. In step P48 a second electrode 16 is deposited as discussed above. The device is then patterned, which may comprise only the patterning of the second electrode if any patterning was done after deposition of the first electrode. It is important that the device be patterned before the second anneal step P50 so that patterning stresses are removed by the anneal and any oxide defects created by the patterning are corrected. The second anneal preferably performed at the same temperature as the first anneal though variance within a small temperature range of 50° C. to 100° C. about the first anneal temperature is possible with some dopants. The time for the second anneal is generally being about 30 minutes, though again a range of times from about 20 minutes to 90 minutes is possible depending on the sample. Again, careful control of the anneal parameters is important to obtain predictable results. Finally, in step 51 the device is completed and evaluated.

Another factor that is important in obtaining good, predictable results in the doped materials is the use of high purity barium, strontium and titanium in making the precursors. Usually, what is called "high purity" barium, strontium, and titanium in the trade has impurity levels for the more abundant elements of between 1 in $10^4$ and 1 in $10^5$ atoms of impurities. Impurity levels this high will be referred to herein as R&D grade materials. Dopings made with such R & D grade materials do not provide as predictable results as dopings made with high purity materials, i.e with impurities of less than 1 in $10^5$ atoms of impurities for any one element, or less than 10 parts per million. Table 1 shows the measured impurity levels in parts per million for the high purity precursor solutions and the R&D grade precursor solutions. Where an entry is left blank the impurity was not specified.

TABLE 1

| IMPURITY | HIGH PURITY SOLUTION Impurity Level in PPM | R & D SOLUTION Impurity Level in PPM |
| --- | --- | --- |
| Na | 4.3 | 65 |
| K | 2.4 | 52 |
| Mn | 0.6 | 31 |
| Fe | <0.3 | 8 |
| Ni | 0.2 | |
| Mg | <0.1 | |
| Ca | 1.9 | |
| Zn | 0.1 | |
| Al | 0.3 | |
| Ag | <0.1 | |
| Cd | <0.1 | |
| Cu | 0.6 | |
| Li | <0.1 | |
| Mo | <2 | |
| Co | <0.1 | |
| Cr | <0.05 | |
| U | <0.002 | <5 |
| Th | <0.002 | <5 |

As indicated in Table 1, the high purity solution did not have any impurity element with a level higher than 4.3 parts per million, and the total impurities were only about 13 parts per million. The R & D grade solutions had impurity levels of 10 to 100 times higher. Preferably the impurity level for most impurities is 1 part per million or less.

In the examples discussed below, all BST was made from a stock solution having a stoichiometric content of barium, strontium and titanium as specified in the formula $Ba_{0.7}Sr_{0.3}TiO_3$. In most cases the dopant precursors were commercially available hexanoates or were made by reacting the dopant with 2-ethylhexanoic acid to make a metal 2-ethylhexanoate: for example, 5.1385 grams (9.9168 millimoles or 518.16 formula weight) of commercially available yttrium 2-ethylhexanoate was dissolved in xylenes and heated to about 135° C. until a volume of about 120 milliliters remained with a mass of 116.5671 grams and a solution concentration of 0.085074 millimole of yttrium per gram of solution. However, octanoate acid was found also to be useful, as for example, yttrium octanoate was used for some yttrium doped samples with little difference in results. Patterning was done in an etchant comprising 1 part of 49% HF and 499 parts water.

Figure 5:
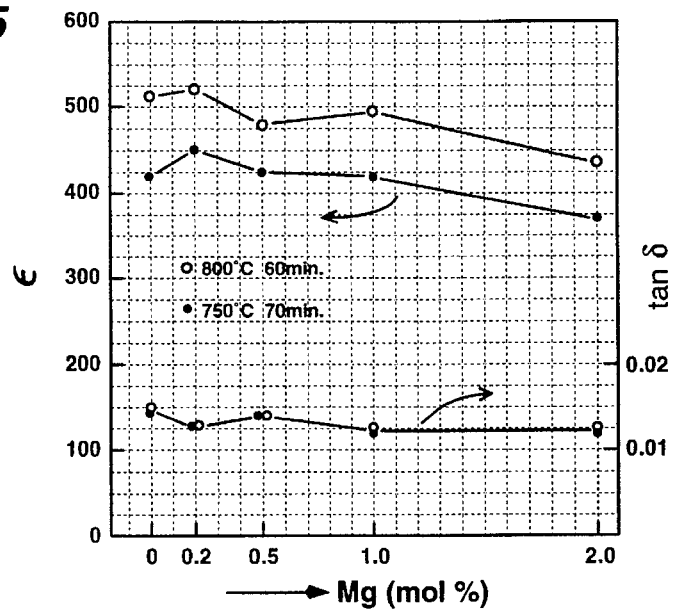
FIG. 5 is a graph of the dielectric constant, $\epsilon$, and dissipation factor, tan $\delta$, versus magnesium content for magnesium-doped BST made according to the process of the invention.
Figure 6:
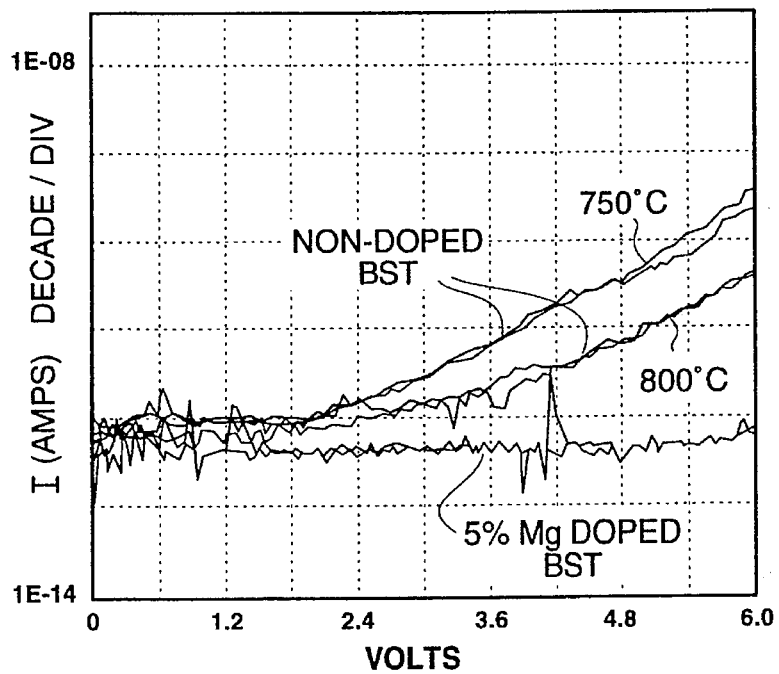
FIG. 6 is a graph of leakage current versus voltage for non-doped BST capacitors and a 5% magnesium-doped BST capacitor made according to the process of the invention.

Samples were made using high purity solutions of BST without any doping and with magnesium doping. In the case of the high purity, non-doped sample, a xylene exchange was performed on a solution of BST stock solution as described above. The xylene exchange included about 0.5 cc of formamide condensation, and the final precursor solution had a molarity of 0.32M. The precursor was applied to the substrate 18, was spun at 1500 RPM for about 30 seconds, dried at 400° C. for 2 minutes on a hot plate in air, and annealed at 750° C. in oxygen for 70 minutes including 10 minute push in and 10 minutes pull out. The final thickness of the BST layer 15 was 1600 Å. The top electrode 16 was deposited and patterned and the capacitor 10 was annealed again at 750° C. for 30 minutes in oxygen, including a 10 minute push in and pull out. For the magnesium-doped samples the parameters were the same except that a magnesium precursor was added in step P43 and the final thickness of the dielectric 15 varied about 10%, with the sample for the 5% magnesium-doped sample (FIG. 6) being about 1750 Å. Samples were made for a variety of magnesium dopings both with the parameters given above and also with the same parameters except that both the first and second anneal steps, P47 and P50, were done at 800° C. instead of 750° C. The electrical properties of the samples were evaluated in step P51 with results as shown in FIGS. 5 and 6. FIG. 5 shows the real part of the dielectric constant, $\epsilon$, the scale for which is on the left, and the dissipation factor, tan $\delta$, the scale for which is on the right, plotted against the magnesium content in mol. %. The samples which were annealed at 750° C. are shown with solid circles, while the samples which were annealed at 800° C. are shown by open circles. The dielectric constant rises at first then drops significantly with increased doping, while the dissipation factor drops slightly or remains about the same. The anneal temperature makes a significant difference with respect to the dielectric constant, $\epsilon$, but makes little difference with respect to the dissipation factor, tan $\delta$. FIG. 6 shows the leakage current in amps plotted against voltage in volts for the 5% magnesium-doped sample and for the non-doped BST samples. The leakage current for the magnesium-doped sample stays low, less than $10^2$ amps all the way out to 6 volts. The leakage current for the non-doped BST samples goes up by a factor of nearly 100 for the 800° C. annealed sample and by a factor of nearly 1000 for the 750° C. annealed sample. The leakage current result for the 5% magnesium-doped sample is excellent. The leakage current stays low for the whole range of voltages used in conventional integrated circuits.

Figure 7:
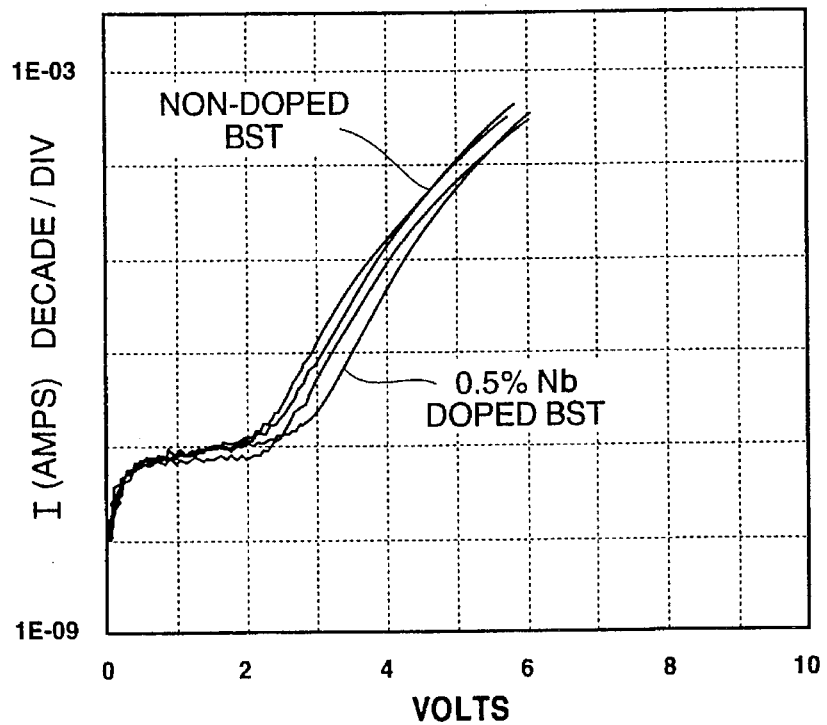
FIG. 7 is a graph of leakage current versus voltage for non-doped BST capacitors and a 0.5% niobium-doped BST capacitor made according to the process of the invention.
Figure 8:
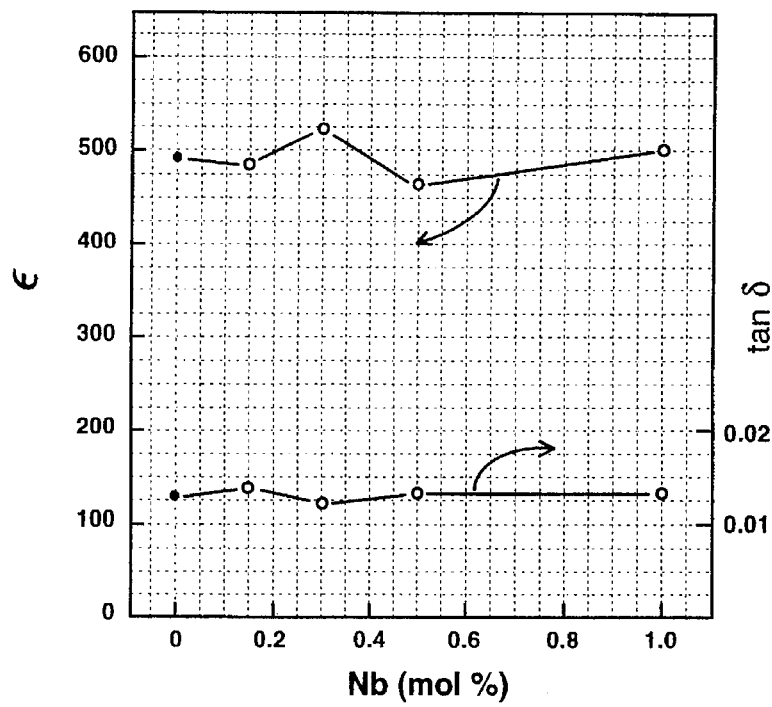
FIGS. 8 through 14 are graphs of the dielectric constant, $\epsilon$, and dissipation factor, tan $\delta$, for BST capacitors doped with niobium, yttrium, bismuth, tin, $BaZn_{1/3}Nb_{2/3}O_3$, $2xSrTa_2O_6$, and strontium bismuth tantalate, respectively, as a function of the mole percentage of the respective dopant.

Similarly sample capacitors 10 as shown in FIG. 1 were made of pure BST and compared with a 0.5% niobium-doped BST sample. The final precursor in each case had a molarity of 0.19M adds was spun at 2,000 RPM for 30 seconds. All anneals were done at 800° C. and were for 1 hour for the first anneals P47 and 30 minutes for the second anneals P50. The final thickness of the pure BST sample was 1,220 Å and the final thickness of the 0.5% niobium-doped sample was 1,194 Å. The measured leakage current in amps versus the voltage in volts is shown in FIG. 7. Again the leakage current for the niobium-doped sample is significantly better than for the pure BST sample, though not as dramatic as for the 5% magnesium-doped sample. FIG. 6 shows a graph of the real part of the dielectric constant, $\epsilon$, and the dissipation factor, tan $\delta$, versus the mol percent of doping as measured for another series of samples. In this case the BST stock solution was made with R & D grade purity materials. In these curves the solid circle represents the measurements on a 1980 Å non-doped BST sample, and the open circles represent the results for niobium samples varying from 1940 Å to 1970 Å. These curves suggest that the dielectric constant may not fall off as fast for the niobium-doped samples as for the magnesium doped samples. However, it must be understood that the results for 5% magnesium-doped BST were extraordinary: though the dielectric constant as low as 156, the leakage current was in the range of $10^{-9}$ A/cm$^2$, the range required for practical device application, up to an applied voltage of 6 more than volts. Thus, the BST according to the invention is very useful for device applications requiring a low leakage current capacitors with a higher capacitance than the approximately 4 capacitance of silicon-based dielectrics.

Figure 9:
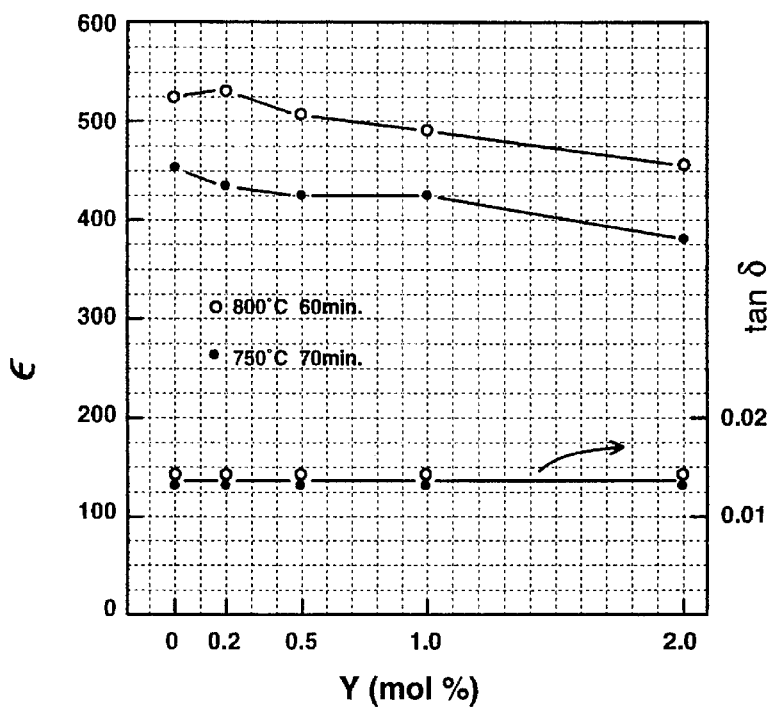
Figure 10:
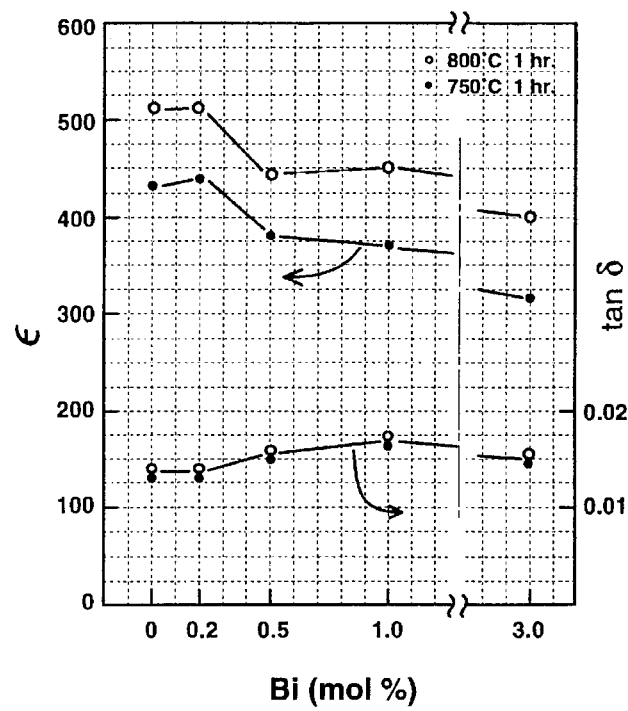
Figure 11:
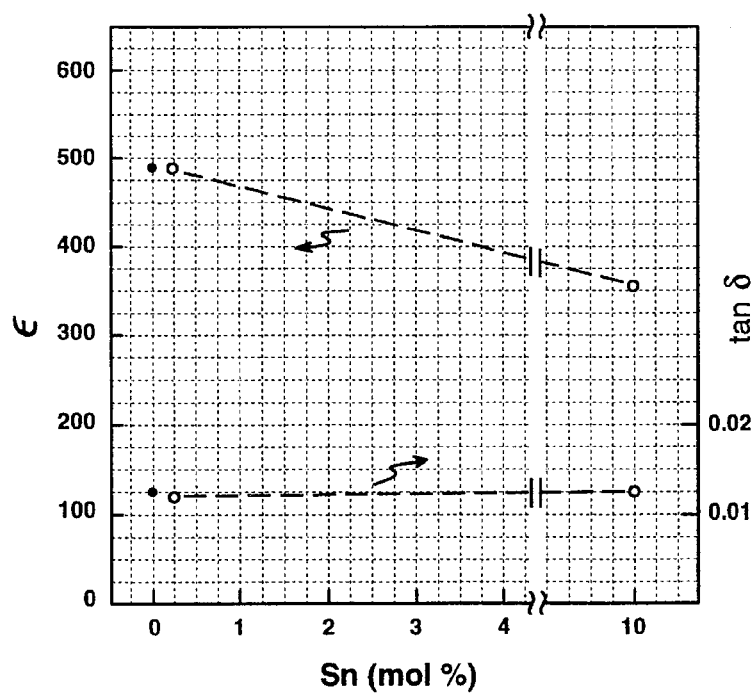
Figure 12:
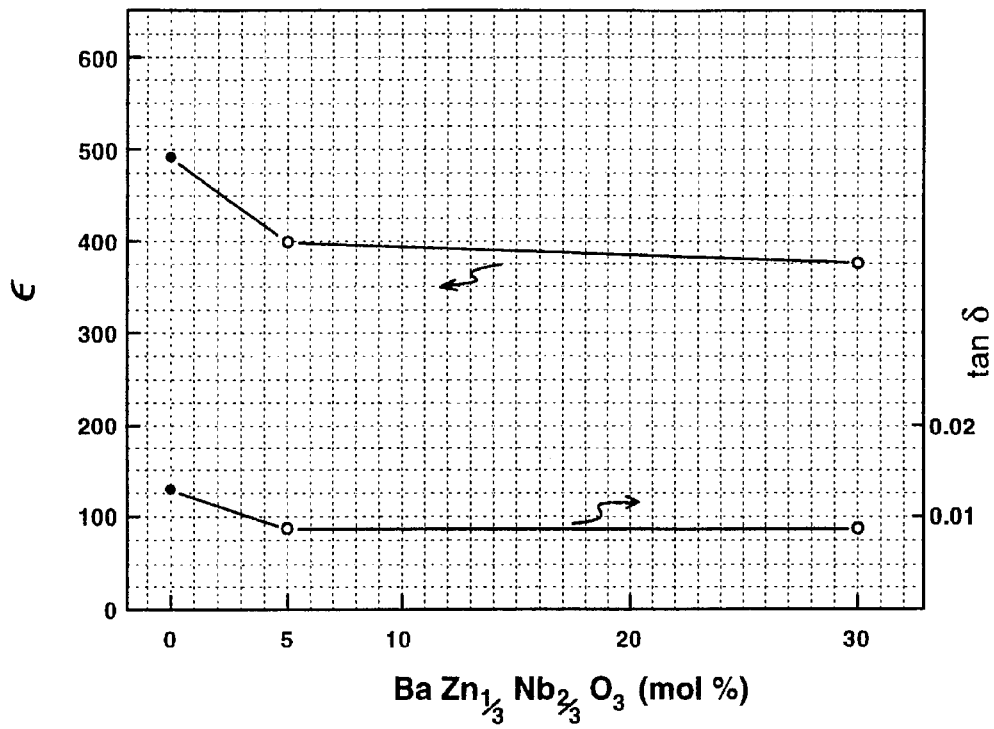
Figure 13:
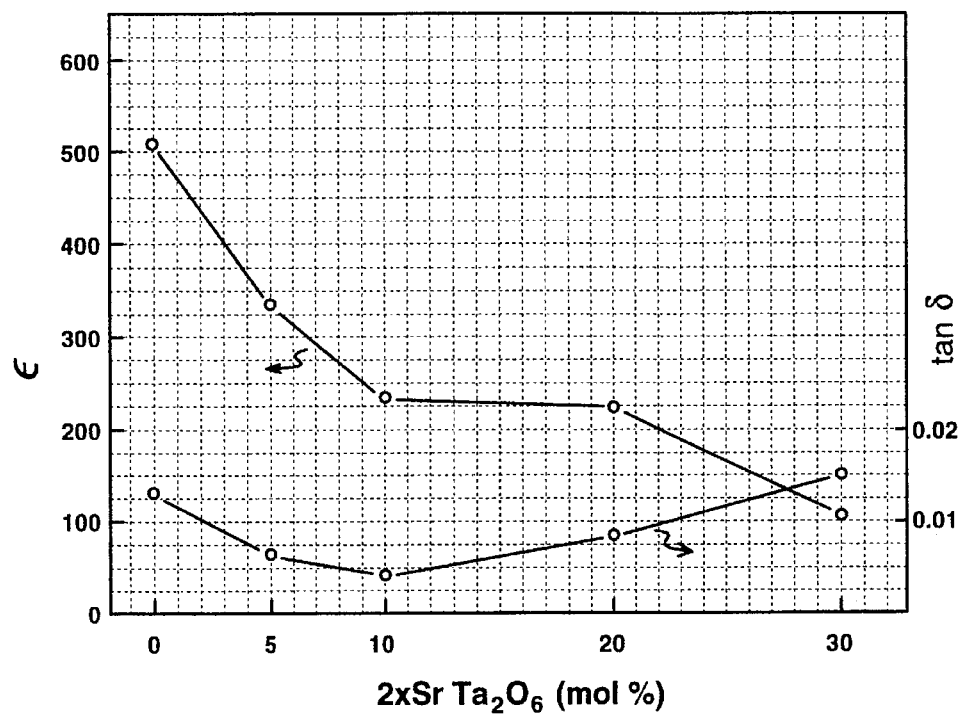
Figure 14:
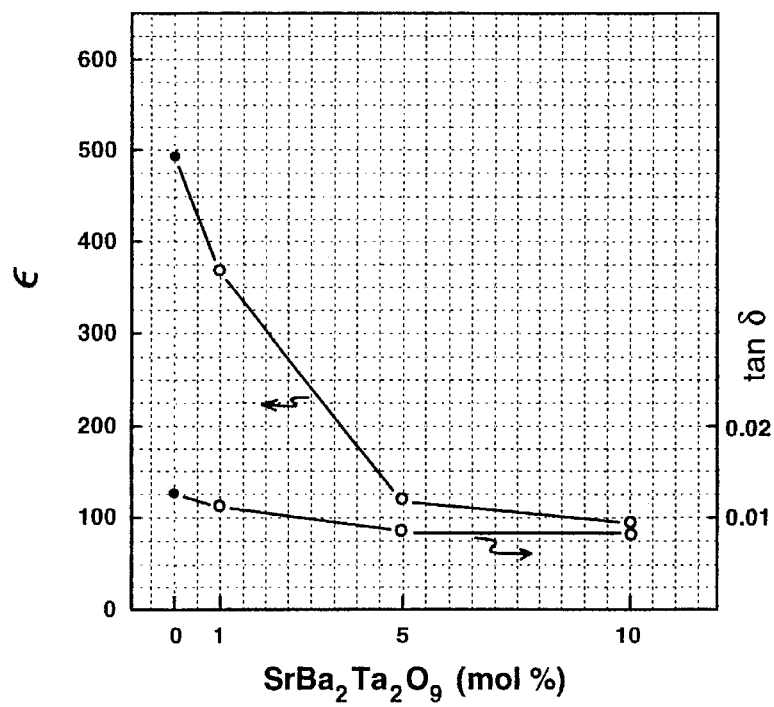

FIGS. 9 through 14 show the results of measurements of the real part of the dielectric constant, $\epsilon$, and the dissipation factor, tan $\delta$, versus doping in mol percent for yttrium, bismuth, tin, $BaZn_{1/3}Nb_{2/3}O_3$, $2xSrTa_2O_6$, and strontium bismuth tantalate, respectively. In FIGS. 9 and 10, the solid circles represent samples that were annealed at 750° C. and the open circles represent samples annealed at 800° C. In FIGS. 11 through 14, the solid circles represent the non-doped sample of 1980 Å thickness mentioned above with respect to FIG. 8, while the open circles represent samples doped as indicated along the abscissa and having dielectric layer 15 thicknesses in the range of 1940 Å to about 2085 Å. In the case of these figures, R & D grade BST was used.

Sample capacitors 10 as shown in FIG. 1 were also made with dysprosium oxide, $Dy_2O_3$, as the dopant material in $Ba_{0.7}Sr_{0.3}TiO_3$. The stock BST solution was a 0.5M BST solution (R & D grade) as described above diluted to 0.3M with n-butyl acetate; e.g. 2 ml of the above BST solution were added to 1.3 ml n-butyl acetate to yield the final BST precursor solution. The dopant solution was dysprosium 2-ethylhexanoate in xylene, with about 0.1109 mmole of Dy per gram. The solution was spun at between 1600 rpm and 2000 rpm and yielded a film of about 700 Å–900 Å per coat. The drying step P46 was performed at 400° C. on a hot plate, in air for 2 minutes. The first anneal step P47 was at 750° C. for 80 minutes in $O_2$, and the 2nd anneal P50 was at 750° C. for 30 minutes in $O_2$. The thickness of the dielectric 15 in the samples was from 1720 Å to 1840 Å.

Figure 15:
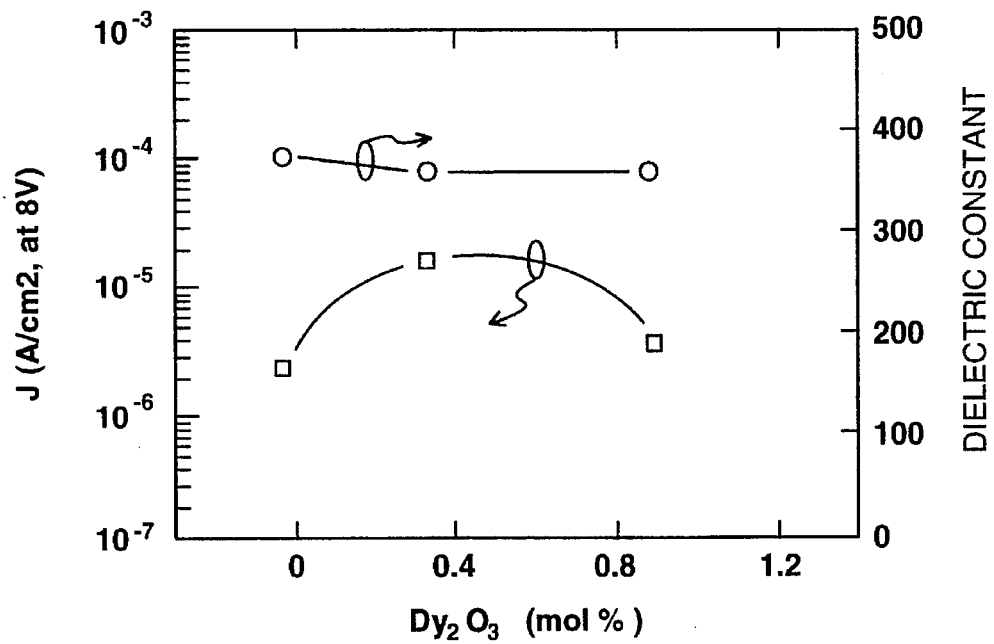
FIG. 15 is a graph of the dielectric constant and current density for BST capacitors doped with dysprosium oxide as a function of the mole percentage of the dopant.

The dysprosium oxide-doped samples were tested with the results shown in FIG. 15. In this figure, the dielectric constant (upper curve/right scale) and current density, J, in amps/$cm^2$ (lower curve/left scale), are plotted as a function of concentration of the $Dy_2O_3$ dopant in mol. %. In this instance, the current density was chosen as the measured function instead of leakage current to make it easier to compare the data to measurements in bulk materials, which are usually given in terms of resistivity, since this parameter is of more importance and easier to measure in bulk samples. (Current density is inversely, but simply related to resistivity.) The results of FIG. 15 agree very closely with the results obtained for bulk dysprosium oxide-doped $Ba_{0.7}Sr_{0.3}TiO_3$. This shows that the process of making doped-BST thin films according to the invention is far superior to prior art processes.

The above results indicate that a wide variation of electrical properties can be obtained by adding a variety of dopants to BST. From FIGS. 5, 8, 9, 10, and 11, one sees that in a doping range of about 0.2% to 0.3% for the dopants Mg, Nb, Y, Bi, and Sn, there is some improvement over the dielectric properties of undoped BST; i.e. the dielectric constant tends to be higher and the leakage current is the same of less. These results indicate that there is an optimum amount of doping to ensure an improvement of the dielectric properties of the $Ba_{0.7}Sr_{0.3}TiO_3$ capacitor. This greatly simplifies the search for the ideal dopant, since one can focus the search in the 0.2% to 3% range, rather than test a much larger number of samples over a broader range.

An important feature of the invention is the ease with which specific doping concentrations can be added. In the prior art, the precise dopant level that one attempted to obtain would generally not be obtained due to inherent randomness in the processes such as sputtering. Rather, in the prior art, one would fabricate a device, then test it to see what concentration was obtained. In the method of fabrication according to the invention, precise and repeatable doping levels can easily be obtained. It should be apparent that the present invention lends itself to manufacturing much more readily than the prior art.

The results also suggest that some materials with very low leakage current but reduced dielectric constant may be made with the doping process of the invention. For example, the 5% magnesium-doped sample (FIG. 6) had a better leakage current than shown by any BST thin film capacitor in the prior art, insofar as the inventors are aware. Such a material lends itself to the capacitor 20 structure shown in FIG. 2. The 5% doped magnesium BST is used for buffer layers 25 and 27, and an undoped BST material is used for the dielectric 26. The low leakage of the 5% magnesium doped layers 25 and 27 provide an extremely low leakage while the undoped BST provides a high dielectric constant. This combination significantly increases the ability for the capacitor 20 to store readable charges even when the capacitor 20 is made very small as compared to the prior art integrated circuit capacitors.

A further feature of the invention is that the metal oxide precursors preferably contain impurities of less than 10 parts per million per impurity element. Relatively small amounts of impurities appear to give the best results in many cases. For example, it appears that for 0.2 moles of magnesium doping the dielectric constant is at a maximum and the leakage current is at a minimum. In general, it appears that a dopant range of 0.1% to 0.5% will provide good electrical properties, and preferably a range of 0.2% to 0.3% give the best properties.

There has been described novel structures and processes for fabricating integrated circuit capacitors using doped metal oxides, such as BST. It should be understood that the particular embodiments shown in the drawings and described within this specification are for purposes of example and should not be construed to limit the invention. Further, it is evident that those skilled in the art may now make numerous uses and modifications of the specific embodiment described, without departing from the inventive concepts. For example, the doped materials and methods described with respect to the capacitor 10 of FIG. 1 may be used with other capacitor structures, such as that of FIG. 3 or many other variations of capacitors; or the buffer layers 25 and 27 of FIG. 2 may be used in combination with the capacitors of FIGS. 1 and 3 as well as other capacitor structures. The structures and processes may be combined with a wide variety of other structures and processes. Equivalent materials, different material thicknesses, and other methods of depositing the substrate and electrode layers may be used. It is also evident that the process steps recited may in some instances be performed in a different order. Or equivalent structures and processes may be substituted for the various structures and processes described.

We claim:

1. A method of fabricating an integrated circuit containing an accurately doped barium strontium titanate layer, said method comprising the steps of:

providing a liquid precursor comprising barium, strontium, titanium and a dopant selected from the group consisting of magnesium; niobium; yttrium; bismuth; tin; dysprosium; combinations of barium, zinc, and niobium; combinations of strontium and tantalum; and combinations of strontium, bismuth, and tantalum;

applying said precursor to an integrated circuit substrate;

treating said precursor to form a doped barium strontium titanate layer on said substrate.

2. A method as in claim 1 wherein said precursor comprises a carboxylate.

3. A method as in claim 1 wherein said step of providing a liquid precursor comprises mixing a BST stock solution with a dopant solution containing said dopant.

4. A method as in claim 3 wherein said dopant solution comprises a carboxylate.

5. A method as in claim 1 wherein said precursor includes a solvent selected from the group consisting of xylenes, n-butyl acetate, and 2-methoxyethanol.

6. A method as in claim 1 wherein said dopant comprises magnesium.

7. A method as in claim 1 wherein said barium, said strontium, and said titanium are high purity research grade materials.

8. A method as in claim 1 wherein said step of treating comprises drying said precursor at a temperature of between 200° C. and 500° C. in an atmosphere selected from air and nitrogen.

9. A method as in claim 8 wherein said temperature is about 400° C.

10. A method as in claim 1 wherein said step of treating comprises annealing at a temperature of between 600° C. and 850° C.

11. A method as in claim 1 wherein said step of providing comprises providing a precursor in a first solvent and performing a solvent exchange to substitute a second solvent for said first solvent.

12. A method as in claim 11 wherein said second solvent comprises a solvent selected from the group xylene and n-butyl acetate.

13. A method as in claim 12 wherein said first solvent is 2-methoxyethanol.

14. A method as in claim 11 wherein said first solvent provides a precursor that stores well and said second solvent provides a precursor that has a lesser viscosity than said precursor with said first solvent.

15. A method as in claim 1 wherein said dopant is at a concentration of from 0.1% molarity to 5% molarity.

16. A method as in claim 15 wherein said dopant is at a concentration ranging from about 0.2% to 0.3% molarity.

17. A method of fabricating an integrated circuit containing an accurately doped metal oxide layer, said method comprising the steps of:

providing a liquid precursor comprising barium, strontium, titanium and a magnesium dopant;

applying said precursor to an integrated circuit substrate;

treating said precursor to form a magnesium-doped metal oxide layer on said substrate.

18. A method as in claim 17 wherein said magnesium is at a concentration ranging from 0.1% molarity to 10% molarity.

19. A method as in claim 18 wherein said magnesium is at a concentration of about 5% molarity.

20. A method as in claim 17 wherein said precursor includes magnesium carboxylate.

21. A method as in claim 20 wherein said dopant comprises magnesium 2-ethylhexanoate.

22. A method as in claim 17 wherein said precursor is a high purity research grade precursor solution.

23. A method of fabricating an integrated circuit containing an accurately doped metal oxide layer, said method comprising the steps of:

providing a high purity liquid precursor comprising a dopant and a plurality of metals in proportions capable of yielding a metal oxide having a formula selected from a group consisting of $ABO_3$ $A'A''BO_3$, and $AB'B''O_3$, wherein A, A', A'', B, B', and B'' are metal cations and O is oxygen;

applying said precursor to an integrated circuit substrate; and treating said precursor to form a doped metal oxide layer on said substrate.

24. A method as in claim 23 wherein said precursor comprises a solvent selected from semiconductor grade purity xylene, n-butyl acetate, and 2-methoxyethanol.

25. A method as in claim 23 wherein said step of providing comprises providing a precursor in a first solvent and performing a solvent exchange to substitute a second solvent for said first solvent.

26. A method as in claim 25 wherein said second solvent comprises a solvent selected from the group xylene and n-butyl acetate.

27. A method as in claim 26 wherein said first solvent is 2-methoxyethanol.

28. A method as in claim 23 wherein said first solvent provides a precursor that stores well and said second solvent provides a precursor that has a lesser viscosity than said precursor with said first solvent.

* * * * *